(12) United States Patent
Alexeyev

(10) Patent No.: US 9,294,127 B2
(45) Date of Patent: Mar. 22, 2016

(54) CURRENT MODE ANALOG BELIEF PROPAGATION

(75) Inventor: Alexander Alexeyev, Beverly, MA (US)

(73) Assignee: Analog Devices, Inc., Norwood, MA (US)

( * ) Notice: Subject to any disclaimer, the term of this patent is extended or adjusted under 35 U.S.C. 154(b) by 491 days.

(21) Appl. No.: 13/819,360

(22) PCT Filed: Sep. 1, 2011

(86) PCT No.: PCT/US2011/050147
§ 371 (c)(1),
(2), (4) Date: May 9, 2013

(87) PCT Pub. No.: WO2012/067692
PCT Pub. Date: May 24, 2012

(65) Prior Publication Data
US 2013/0219245 A1     Aug. 22, 2013

Related U.S. Application Data

(60) Provisional application No. 61/379,241, filed on Sep. 1, 2010, provisional application No. 61/380,971, filed on Sep. 8, 2010, provisional application No. 61/423,075, filed on Dec. 14, 2010.

(51) Int. Cl.
*G06G 7/00* (2006.01)
*H03M 13/11* (2006.01)
*G06N 7/00* (2006.01)
*H03M 13/00* (2006.01)

(52) U.S. Cl.
CPC .............. *H03M 13/11* (2013.01); *G06N 7/005* (2013.01); *H03M 13/1111* (2013.01); *H03M 13/6597* (2013.01)

(58) Field of Classification Search
None
See application file for complete search history.

(56) References Cited

U.S. PATENT DOCUMENTS

| | | | |
|---|---|---|---|
| 7,669,106 B1 * | 2/2010 | Farjadrad | 714/758 |
| 2005/0240647 A1 | 10/2005 | Banihashemi et al. | |
| 2007/0194810 A1 * | 8/2007 | Hannah et al. | 326/115 |
| 2008/0174460 A1 * | 7/2008 | Vigoda | 341/118 |
| 2010/0033228 A1 * | 2/2010 | Gershenfeld et al. | 327/334 |
| 2011/0255612 A1 * | 10/2011 | Bernstein et al. | 375/259 |
| 2013/0313802 A1 * | 11/2013 | Kraus et al. | 280/257 |

FOREIGN PATENT DOCUMENTS

| | | |
|---|---|---|
| WO | WO 2008/034254 | 3/2008 |
| WO | WO 2008/141453 | 11/2008 |

OTHER PUBLICATIONS

Vigoda, B. "Analog Logic: Continuous-Time Analog Circuits for Statistical Signal Processing," [retrieved from the internet: http://media.mit.edu/physics/publications/theses/03.07.vigoda.pdf. retrieved Jun. 4, 2008).

Tanaka et al., "Rewritable Programmable Logic Array of Current Mode Logic," *IEEE Transactions on Computers*, vol. C-30, No. 3, pp. 229-234 (1981).

Hemati et al., "A 0.18-CMOS Analog Min-Sum Iterative Decoder for a (32,8) Low-Density Parity-Check (LDPC) Code," *IEEE Journal of Solid State Circuits*, vol. 41, No. 11, pp. 2531-2540 (2006).

* cited by examiner

*Primary Examiner* — Tan V. Mai
(74) *Attorney, Agent, or Firm* — Patent Capital Group

(57) ABSTRACT

An analog belief propagation system uses current mode implementations of storage elements and circuit implementations of at least some nodes of a factor graph using current representations. The system mitigates or avoids effects of non-linearities and approximations in storage and processing elements of the system, for instance, by using storage cells that reproduce current values and using factor circuits that separate control sections and signal path sections of the circuits.

20 Claims, 8 Drawing Sheets

$Y_j = + X_{jmin} \Rightarrow B_j^{++}, B_j^{--}$ $Y_j = - X_{jmin} \Rightarrow B_j^{-+}, B_j^{+-}$ $Y_j = + X_{jmin2} \Rightarrow D_j^{++}, D_j^{--}$ $Y_j = - X_{jmin2} \Rightarrow D_j^{-+}, D_j^{+-}$

CURRENT MODE ANALOG BELIEF PROPAGATION

CROSS REFERENCE TO RELATED APPLICATION

This application is the national phase under 35 USC 371 of international application no. PCT/US2011/050147, filed Sep. 1, 2011, which claims the benefit of the priority date of U.S. application No. 61/379,241, filed Sep. 1, 2010, U.S. application No. 61/380,971, filed Sep. 8, 2010, and U.S. application No. 61/423,075, filed Dec. 14, 2010. The contents of the aforementioned applications are incorporated herein in their entirety.

STATEMENT AS TO FEDERALLY SPONSORED RESEARCH

This invention was made with government support under FA8750-07-C-0231 awarded by the Defense Advanced Research Projects Agency (DARPA). The government has certain rights in the invention.

This application is related to U.S. application Ser. No. 12/716,121, titled "Belief Propagation Processor," filed on Mar. 2, 2010, and corresponding PCT Application No. PCT/US10/25956, published as WO/2010/101944A1 on Sep. 10, 2010. These applications are incorporated herein by reference.

BACKGROUND

This invention relates to an analog belief propagation, and in particular to a current mode implementation of belief propagation a processor.

Soft logic processing with analog values has a number of applications, including in decoding of Low Density Parity Check (LDPC) codes. A number of algorithms have been proposed for processing digital or analog representations of values, including the Sum-Product (SP) algorithm, which is sometimes referred to as a Belief Propagation Algorithm, and the Min-Sum (MS) algorithm (also referred to as Max-Sum or Max-Product), which can be regarded as an approximation of the SP algorithm. A description of such algorithms may be found in H. Wymeersch, *Iterative Receiver Design*, Cambridge University Press, Cambridge, 2007.

One representation of belief propagation process makes use of a bipartite graph referred to as a "factor graph," which includes variable (equals) nodes and factor (or constraint) nodes. Messages are iteratively passed between the nodes in a convergent process. One specific belief propagation process is used for error correction decoding in which the variables are bits of a codeword, and the factors are parity constraints among subsets of bits of the codeword.

Circuit implementations of the min-sum algorithm for error correction decoding generally involve two kinds of soft-gates: equals and XOR, corresponding to variable nodes and factor nodes of a factor graph, respectively. The connectivity of the factor graph that defines the connectively between the soft equals and soft XOR is based on the check-matrix associated with the specific error correcting code. When using a log-likelihood ratio (LLR) representation for the messages, the operations required by the min-sum algorithm for each soft-gate type are as follows.

Soft equals: each output is the sum of all included inputs. For a given output, all inputs are included except the input corresponding to the same edge as the output being computed.

Soft XOR: each input is represented as a sign and magnitude, the latter being the absolute value of the input. The sign of each output corresponds to the product of the sign of all included inputs, treating the sign as +/−1. This is equivalent to the logical XOR of the sign of all included inputs, treating a positive sign as a 0 and minus sign as a 1. The magnitude of each output corresponds to the minimum of the magnitudes of each included input. For a given output, all inputs are included except the input corresponding to the same edge as the output being computed. (For all outputs that do not correspond to the input with the minimum magnitude, the magnitude of the outputs are identical—the value of the minimum input magnitude. For the output corresponding to that input, the output is the minimum of all other inputs.)

SUMMARY

In an aspect, in general, an analog belief propagation system uses current mode implementations of storage elements and circuit implementations of at least some nodes of a factor graph using current representations. The system mitigates or avoids effects of non-linearities and approximations in storage and processing elements of the system, for instance, by using storage cells that reproduce current values and using factor circuits that separate control sections and signal path sections of the circuits.

In another aspect, in general, Soft XOR gates, and Soft Equals gates implement nodes of the factor graph to process current representations of messages, and makes use of an overall architecture described in the incorporated "Belief Propagation Processor" patent application.

In some implementations, this Min-Sum approach provides improved performance over previous approaches, possibly in part by mitigating or avoiding effects of non-linearities and approximations in storage and processing elements of the system.

In another aspect, in general, an analog storage cell includes an input for accepting a current encoded value in a writing mode. The storage cell includes a transforming element that is coupled to the input in the writing mode and produces a voltage according to a substantially non-linear voltage-current relationship of the transforming element. The storage cell includes a voltage storage element that retains the produced voltage value. In a reading mode, the voltage on the voltage storage element provides an input to the transforming element. In the reading mode, the transforming element reproduces the input current according to the voltage-current relationship.

Advantages may include one or more of the following.

The same transforming element is used during the writing and the reading modes, and therefore the accuracy of reproducing the input current does not substantially depend on the specific non-linear relationship.

In some examples, the current-to-voltage relationship is compressive (e.g., logarithmic) providing both high accuracy at low current values as well as a large range of reproducible current values.

Other features and advantages of the invention are apparent from the following description, and from the claims.

DESCRIPTION

The incorporated patent application titled "Belief Propagation Processor" includes a description of one or more implementations of approximation of the Sum-Product algorithm using analog signals and storage values. In general, these described implementations make use of a scheduled sequencing of interconnections of three primary types of storage or processing elements, namely: storage elements, soft XOR elements, and soft Equals elements. In at least some parts of the processor, signal values are represented as currents. Such current representation has a benefit, for example, for implementing a distributed summation of terms by accumulating current on a bus-like structure from a set of current sources. In at least some of the implementations described in the incorporated application, other elements process signals represented as voltages. For example, storage elements may maintain state as a voltage or charge that is proportional to a current value to be stored. As another example, a soft XOR makes use of voltage input values.

This document provides a description of an improved believe propagation processor suitable for decoding applications in which the storage elements, factor elements (e.g., soft XOR elements), or both are implemented to directly process current representations of signal values. Furthermore, an exact or approximate Min-Sum approach is used.

Figure 1:
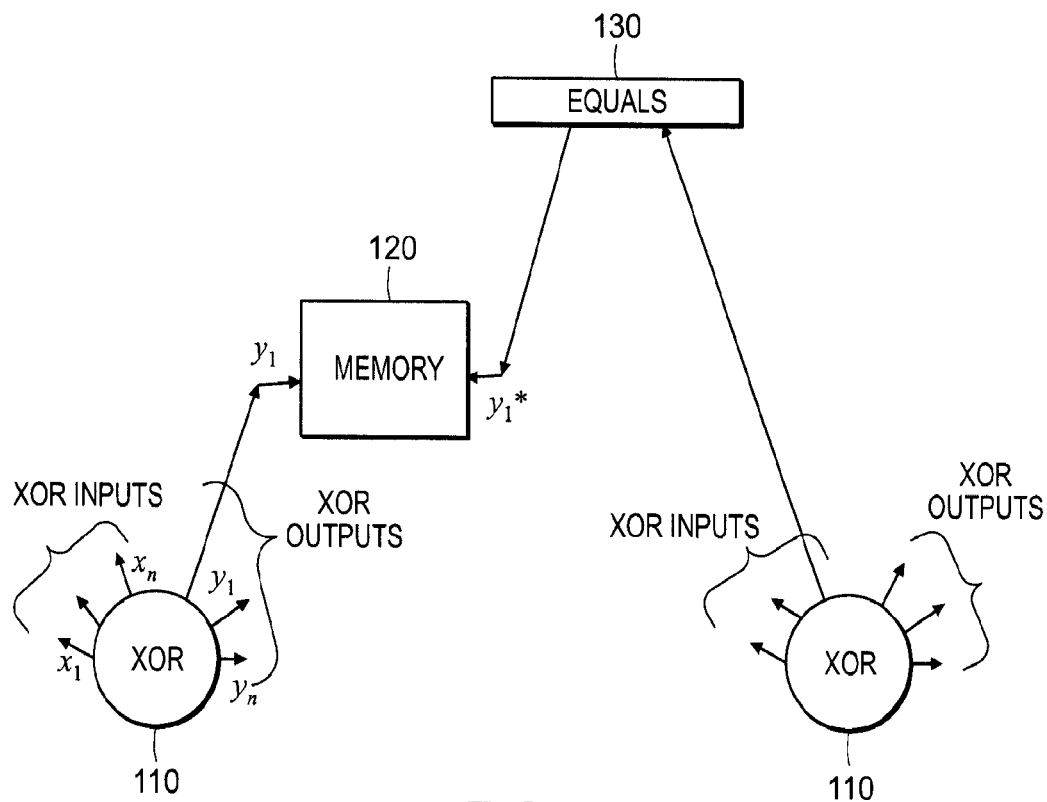
FIG. 1 is a block diagram of a portion of a decoder.

Referring to FIG. 1, a portion of a signal path in a current-mode decoder includes a memory cell 120, which accepts a signal value from an XOR gate 110 and provides its output to an Equals gate 130, which in turn provides its output to the input of a soft XOR gate 110. The signal values passing between elements are represented as currents. For consistency with other diagrams the directions of arrows indicate direction of current flow rather than direction of information flow. For example, in the embodiment being described, both the inputs and outputs of the example of memory cells 120 accept (sink) current. In some examples, including as described below, the soft XOR gate 110 sources current to the memory cell 120 that is being written, and the memory cell 120 sinks current from the Equals gate 130 that accepts the signal value. Similarly, the Equals gate sinks its output current from the Soft XOR accepting its input. That is, the reference direction of the currents representing the signal values (messages) passing between elements switches at the memory cell and at the Soft XOR. Furthermore, the signals are implemented as differential currents, with the difference of currents on two is used to represent a range of positive and negative signal values.

Below, details of one or more current-mode implementations of each of the three primary types of elements are described.

In some implementations of the Min-Sum algorithm, intermediate results of the computations are stored in memory. This allows a number of computation elements that perform the soft equals and soft XOR computations to be reused in performing the overall Min-Sum algorithm. If this approach is used, then memory elements are needed as part of the computation in addition to the soft equals and soft XOR.

Figure 2A:
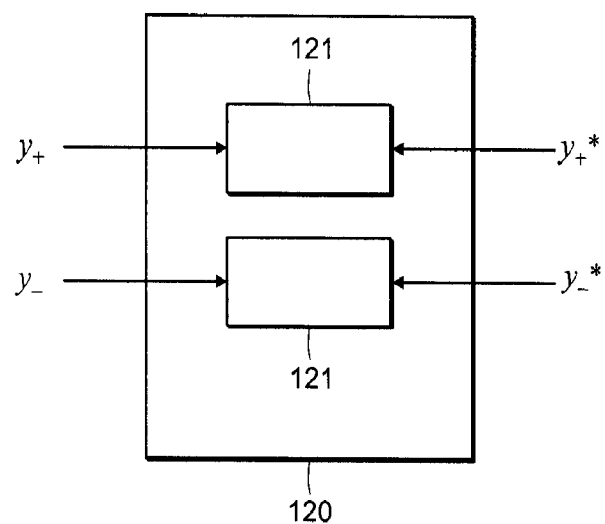
FIG. 2A is a block diagram of a differential current memory cell.
Figure 2B:
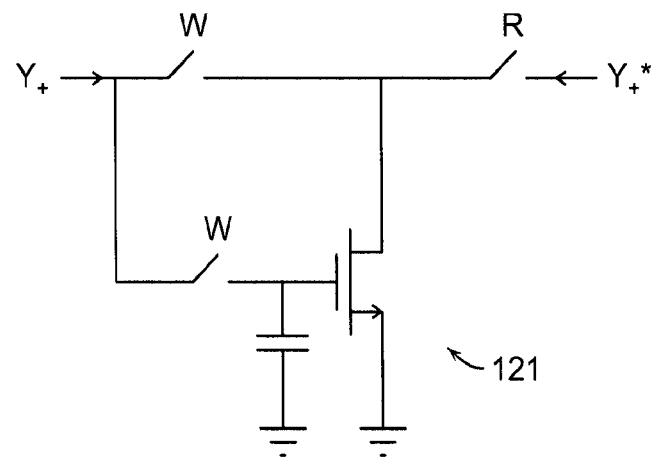
FIG. 2B is a schematic diagram of circuit for one polarity of the memory cell of FIG. 2A.

Referring to FIGS. 2A-2B, in a system in which an input signal value is represented as a current rather than a voltage, one approach is to convert the input current to a voltage, for example, by passing the current through a resistor, and using the voltage drop over the resistor to charge the capacitor. On output, a similar approach may be used to covert the sensed voltage to a current.

Referring to FIG. 2A, in some implementations, each memory cell 120 includes two sections 121, one for each polarity of the differential signal.

Referring to FIG. 2B, an example circuit for one of the section 121 includes an NMOS transistor which can be configured in a writing mode in which the switches labeled "W" are closed to store a charge on a capacitor coupled to the gate that is monotonically related to the input current. During a reading mode in which the switch labeled "R" is closed, the stored voltage on the capacitor causes the output current to reproduce the input current.

Generally, operation of the memory cell can be understood based on operation of a current mirror circuit in which one transistor senses the input current, and a second transistor has its gate voltage tied to the gate voltage of the first transistor, thereby mirroring the input current in the current through the second transistor. In the memory cell shown in FIG. 2A, the gate voltage of the first transistor is not tied to a second transistor. Rather, one transistor serves both the purpose of the input transistor of a current mirror circuit, and later serves the purpose of the output transistor. Rather than tying the gates of the two transistors together, the gate voltage is stored while the single transistor is serving the purpose of the input transistor, and the stored voltage is applied to the gate when the transistor is serving the purpose of the output transistor. In a current mirror, the two transistors must have matched characteristics in order to achieve accurate mirroring of the current. In the memory cell approach, the same transistor is used for both sensing and output, and therefore the transistors in the two phases are the same and therefore well matched.

Figure 2C:
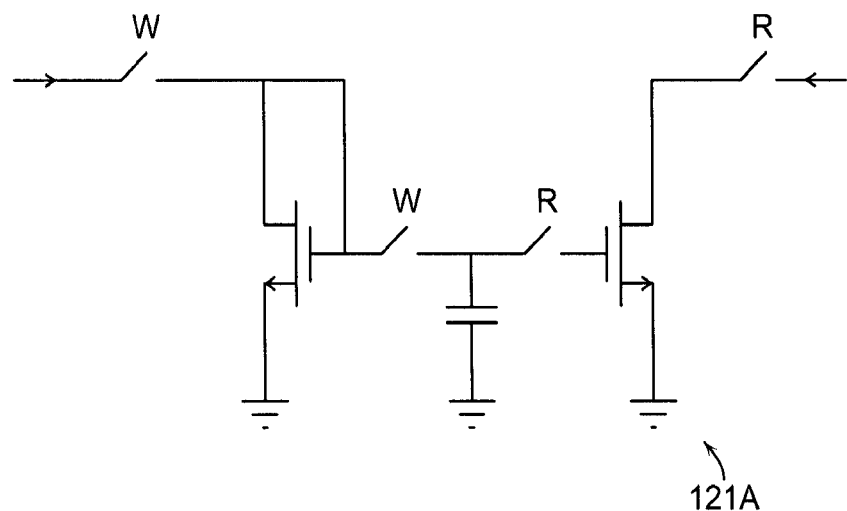
FIG. 2C is a schematic diagram for an alternative circuit for a memory cell.

Referring to FIG. 2C, in some examples of a memory cell 121A, separate matched transistors are used such that one transistor is used on the input during the writing phase to set the capacitor voltage, and the other transistor is used for output during the reading phase. In some examples, which are not shown in the figure, multiple output transistors may be used to provide an output on selected corresponding output lines (e.g., busses).

As introduced above, a Soft Equal element 130 (see FIG. 1) implements a sum when the signals represent log likelihood values. When any input value contributes to only one summation, a simple bus-based current summation may be used, for example, as described in the "Belief Propagation Processor" application. When a signal value is required in multiple summations, one approach is to replicate the current using a current mirror circuit.

As introduce above, above, in a Min-Sum implementation with log likelihood signal values, an N-input bidirectional XOR circuit 110 implements N XOR functions, where each output signal excludes the corresponding input.

To be more precise, let $x_1, \ldots, x_N$ be the log likelihood inputs to the bidirectional XOR 110, and $y_1, \ldots, y_N$ be the corresponding outputs. Each input and output can be considered to has a sign and a magnitude such that $x_1 = \text{sgn}(x_i)\text{mag}(x_i)$, where $\text{sgn}(x_1) = \pm 1$ and $\text{mag}(x_i) \geq 0$, and similarly $y_i = \text{sgn}(y_i)\text{mag}(y_i)$. In this notation, the XOR circuit is designed to implement $\text{sgn}(y_i) = \Pi_{j \neq i} \text{sgn}(x_j) = \text{sgn}(x_i) \Pi_j \text{sgn}(x_j) = \text{sgn}(x_i)S$, and $\text{mag}(y_i) = \min_{j \neq i} \text{mag}(x_j)$.

Figure 3A:
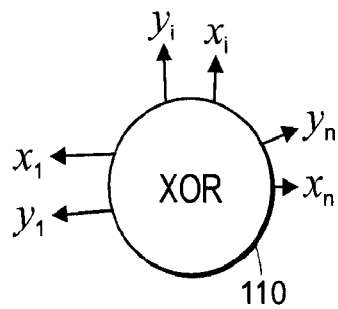
FIG. 3A is a schematic of a bidirectional Soft XOR gate.
Figure 3B:
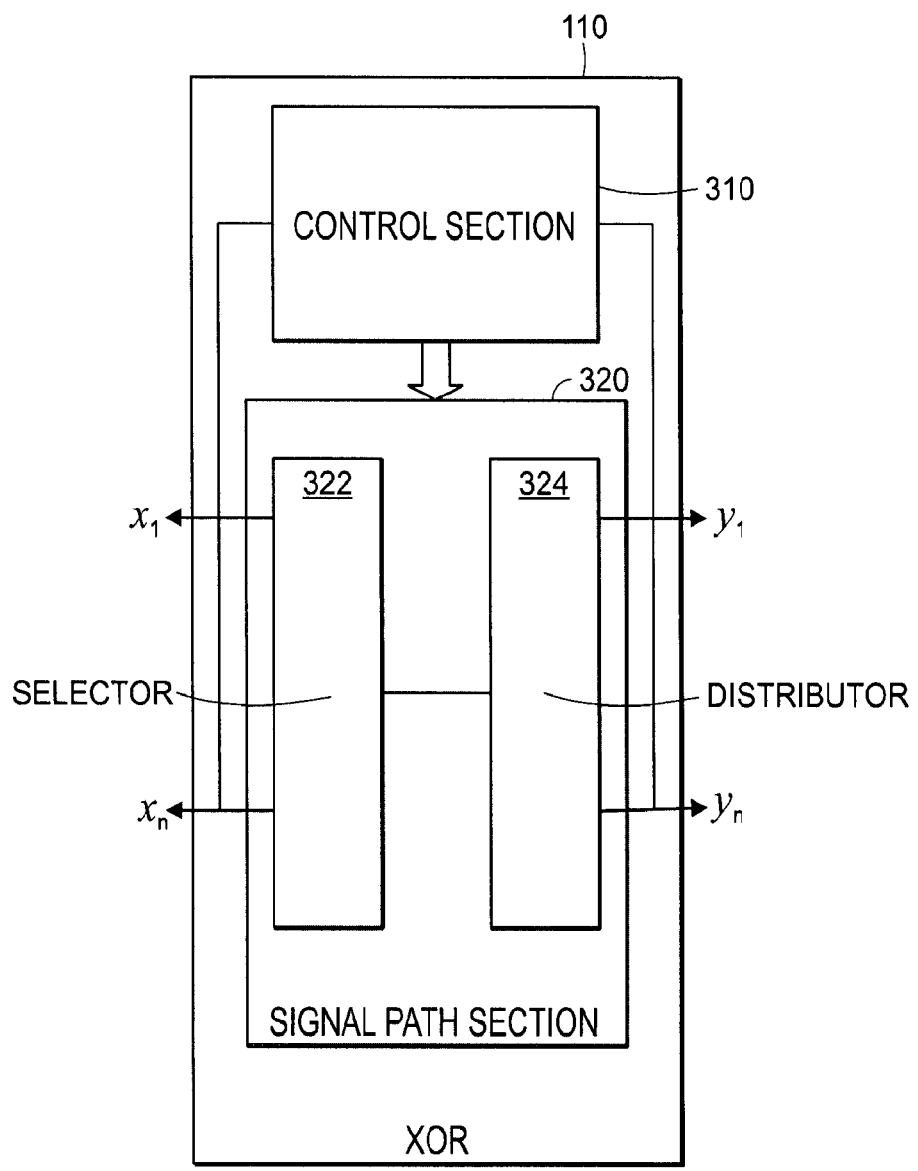
FIG. 3B is a block diagram of a bidirectional Soft XOR gate.

Referring to FIG. 3B, in this implementation, the Soft XOR circuit 110 includes a control section 310 and a signal path section 320. In the Figure, $\underline{x} = (x_1, \ldots, x_N)$ and $\underline{y} = y_1, \ldots, y_N)$. Generally, the signal path section 320 provides a low-distortion path for the current-represented signal values from input to output, while the control section 310 computes values that configure the signal path section.

The control section functionally determines the following values:

$$\{\text{sgn}(x_j), j = 1, \ldots, N\},$$

$$j\min = \arg\min_j \text{mag}(x_i), \text{ and}$$

$$j\min 2 = \arg\min_{j \neq j\min} \text{mag}(x_i).$$

In some examples, the values jmin and jmin2 are produced as a set of N indicator signals:

$$\text{ismin}_j = \begin{cases} 0 & \text{if } j \neq j\min \\ 1 & \text{if } j = j\min \end{cases}$$

and $$\text{ismin2}_j = \begin{cases} 0 & \text{if } j \neq j\min 2 \\ 1 & \text{if } j = j\min 2 \end{cases}$$

The signal path section functionally implements the following:

$$y_i = \begin{cases} S\text{sgn}(x_i)\text{sgn}(x_{j\min 2})x_{j\min 2} & \text{if } i = j\min \\ S\text{sgn}(x_i)\text{sgn}(x_{j\min})x_{j\min} & \text{if } i \neq j\min, \end{cases}$$

where $$S = \prod_j \text{sgn}(x_j).$$

Continuing to refer to FIG. 3B, the signal path section 320 includes a selector 322, which generally outputs signals representing $x_{j\min}$ and $x_{j\min 2}$, and a distributor 324 which uses those signals to produce the current signals $\underline{y} = (y_1, \ldots, y_N)$. For both the inputs and the outputs, in this example the reference direction for the currents is as sourced by the XOR 110.

Figure 3C:
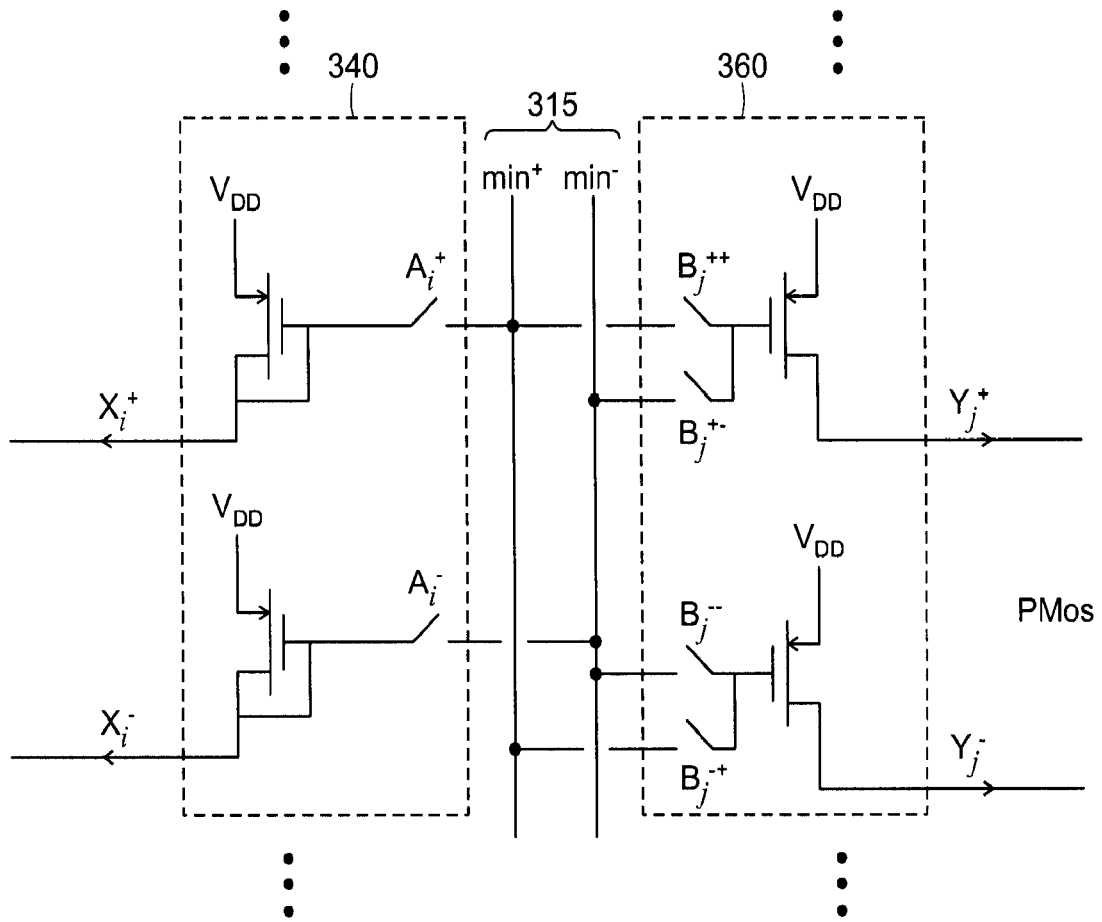
FIG. 3C is a schematic diagram of a circuit for a portion of a Soft XOR gate.

Referring to FIG. 3C, a simplified circuit similar to that used to implement the signal path section includes a selector section 340 and a distributor section 360 switchably coupled by a differential bus 315. The selector section includes a pair of PMOS transistors, one coupled to each polarity of an input $x_i$. Similarly, the output section includes a pair of PMOS transistors, one coupled to each polarity of an output $y_j$. The illustrated switches are such that different current mirror arrangements can be selected. In particular, the relationship $y_j = x_1$ can be implemented by closing switches $A_i^+, A_i^-, B_j^{++}$, and $B_j^{--}$, while $y_j = -x_i$ can be implemented by closing switches $A_i^+, A_i^-, B_j^{+-}$, and $B_j^{-+}$. As introduced above, and example of an output $y_j = S\text{sgn}(x_i)\text{sgn}(x_{j\min})x_{j\min}$, which is either $+x_{j\min}$ or $-x_{j\min}$, which is generally implemented using a circuit approach shown in FIG. 3C.

Figure 4:
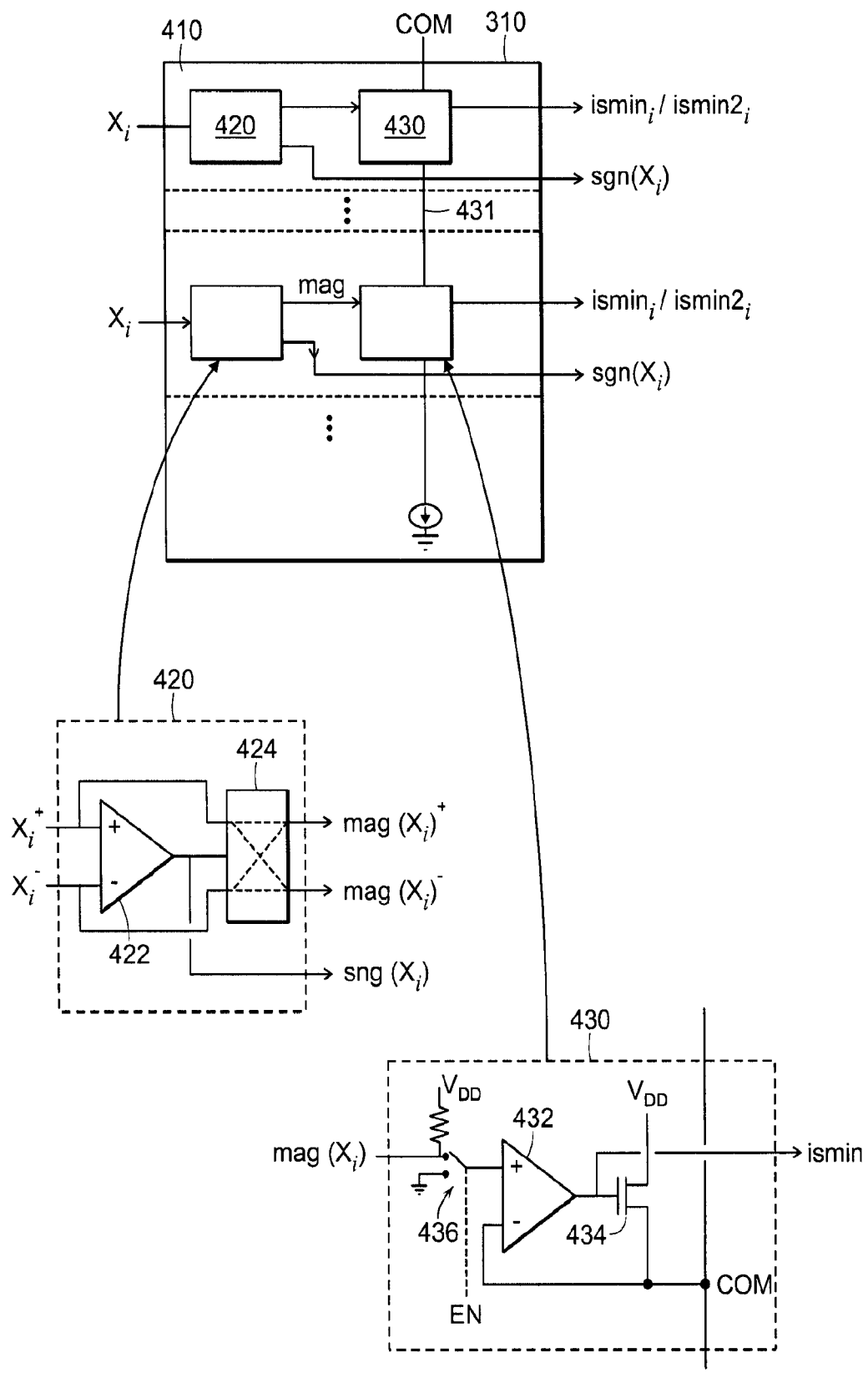
FIG. 4 is a block diagram of a control section of a bidirectional Soft XOR gate.

Referring to FIG. 4, the control section 310 includes N sections 410, each associated with one of the inputs. Each section includes a magnitude section 420, and a winner-takes-all section 430. The magnitude section 420 includes a comparator 422, which controls a "multiplier" section 424, which is implemented using switches to exchange (i.e., multiplication by −1) or not exchange (i.e., multiplication by 1) the pair of differential signals. In FIG. 4, a differential signal representation is shown, and the output of the comparator controls the multiplier 424 to exchange its inputs to multiply by minus 1, and to pass its inputs directly to multiply by plus 1. The outputs of the magnitude section for an input $x_i$ is therefore a representation of $\text{mag}(x_i)$ and a representation of the sign $\text{sgn}(x_i)$. The magnitude is for a variable is passed to the corresponding rank order filter section 424, which are all coupled via a common single line 431, labeled "COM". Generally, the winner takes all section produces a "1" output if the input is the largest of the inputs to the winner-takes-all section, and "0" otherwise. The operation can of this section can be understood by considering the situation in which mag $(x_i)$>COM. In that case, the output of the comparator 432 drives the transistor 434 to bring COM up to $\text{mag}(x_i)$ and the output $\text{ismin}_i$ to "1". The combination of these sections 430 yields a "1" on the section with the minimum input magnitude. Note that in some situations in which the there are multiple close inputs near the maximum, the outputs $\text{ismin}_i$ are passed through a priority encoder (not shown) so that only a single value is "1".

In order to obtain both the $\text{ismin}_i$ and $\text{ismin2}_i$ values, in some implementations, the sections 430 are used twice, for example, in successive phases of a control clock. In the first phase, the minimum of all the values is obtained, and the $\text{ismin}_i$ values are saved in latches (not shown). In the second phase, the section 430 of the minimum is not enabled (e.g., illustrated as a switch controlled by an enable signal "EN"), and the result is the second largest, and the outputs are latched as the values $\text{ismin2}_i$.

Figure 5A:
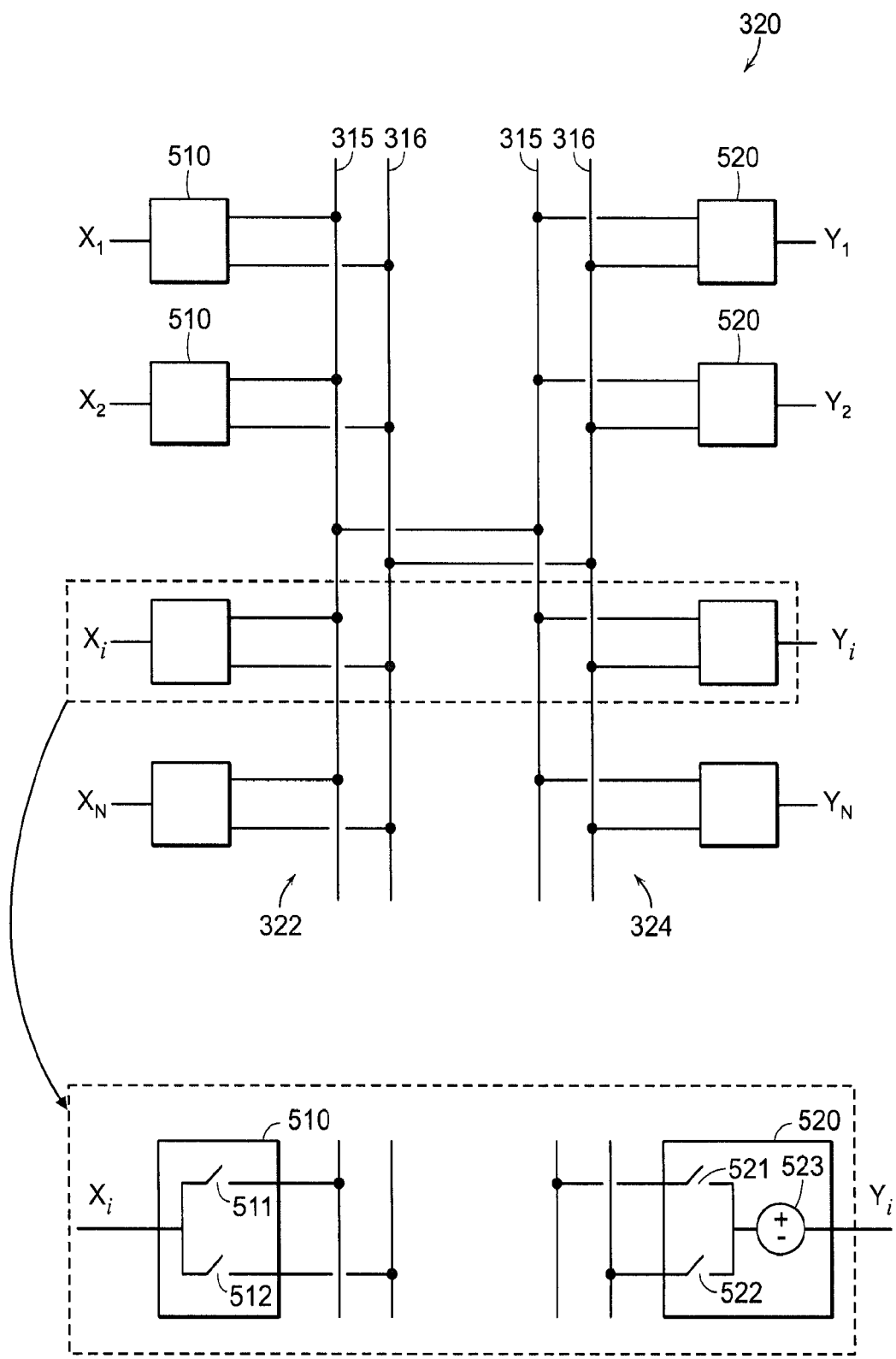
FIG. 5A is a block diagram of a signal path section of a bidirectional Soft XOR gate.

Referring to FIG. 5A, in one implementation of the signal path section 320, the selector 322 includes a set of switch sections 510 each with one output switchably coupled to a "min" bus 315 and one output coupled to a "min2" bus 316. Only one switch 510 for the input jmin couples its input to the "min" bus 316, and one switch 510 for input jmin2 couples its input to the "min2" bus. The switch sections 510 are controlled by the $\text{ismin}_i$ and $\text{ismin2}_i$ signals generated by the control section 310.

In an embodiment of the distributor 324, a set of switch sections 520 couple the busses to the outputs. Logical operation of the switch sections 510 and 520 can be understood as closing switch 511 for the jmin section can switch 512 for the jmin2 section. At the output, either switch 521 or 522 is closed depending on whether the output depends on $x_{j\min}$ or $x_{j\min 2}$, and a plus or minus one multiplier 523 is set depending on the needed polarity.

Figure 5B:
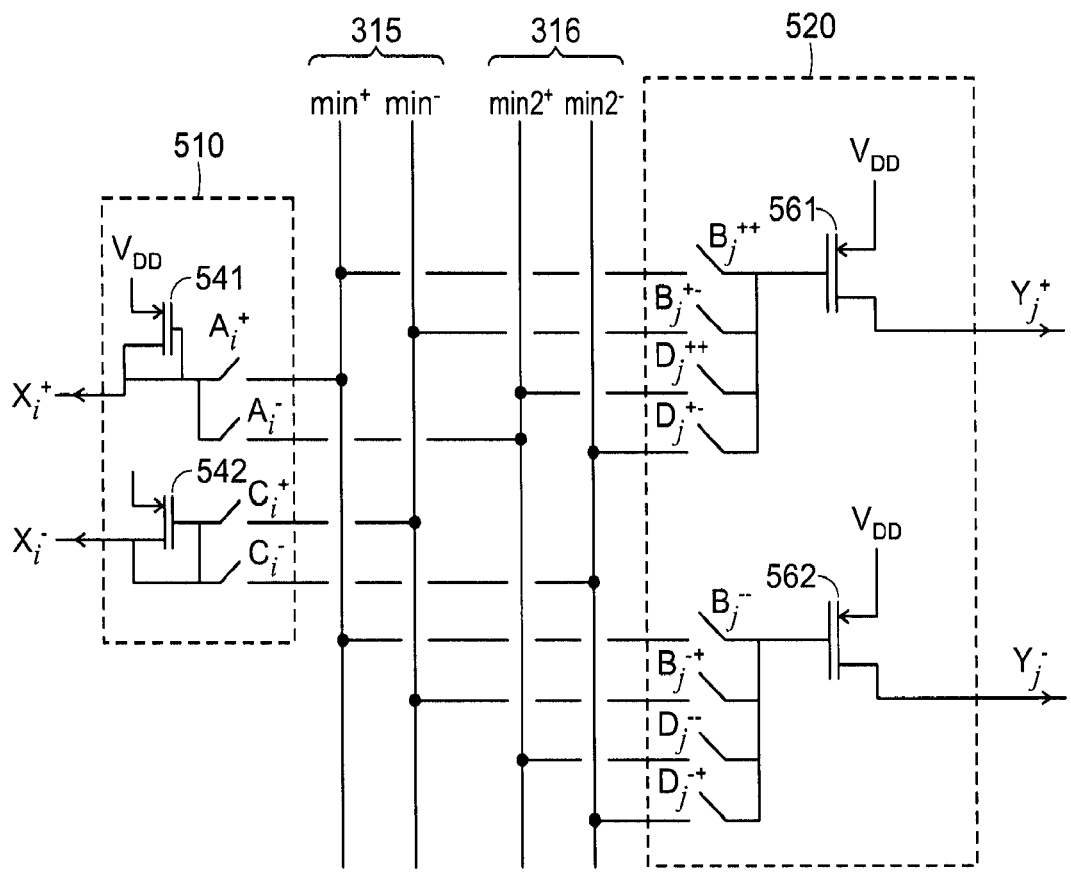
FIG. 5B is a schematic diagram of a circuit for a portion of a Soft XOR gate.

Referring to FIG. 5B, a schematic of a portion of the signal path section 320 includes a selection section 510 and a distributor section 520, switchably coupled with differential "min" 315 and "min2" 316 busses. Using this circuit arrangement, output $y_i$ can be set one of the current signals $x_{j\min}, -x_{j\min}, x_{j\min 2},$ or $-x_{j\min 2}$, depending of the signals $\text{ismin}_i$ and $\text{ismin2}_i$ as well as $\text{sgn}(x_i)$ and the sign of $x_{j\min}$ and $x_{j\min 2}$ generated by the control section. In particular, the relationship $y_j = +x_{j\min}$ can be implemented by closing switches $B_j^{++}$, and $B_j^{--}$, while $y_j = -x_{j\min}$ can be implemented by closing switches $B_j^{+-}$, and $B_j^{-+}$. Similarly, the relationship $y_j = +x_{jmin2}$ can be implemented by closing switches $D_j^{++}$, and $D_j^{--}$, while $y_j = -x_{jmin2}$ can be implemented by closing switches $D_j^{+-}$ and $D_j^{-+}$.

In some examples, the control section is used to limit the magnitude of the output to current by introducing an addition reference input $x_0$. If all the magnitudes of the input values $x_i$ exceed this reference input, then both jmin and jmin2 are set to zero, resulting in the outputs $y_i$ being limited in magnitude to $x_0$.

In some embodiments, the data flow through the Soft XOR is staged by enabling different stages in successive phases of a clocked iteration. In some examples, the comparators 422 (see FIG. 4) are first enabled, then the first use of the winner-take-all sections 430 in a second phase, then the second use of the section 430 in a third phase, then the switch sections 510 are enabled in a fourth stage, and finally the output sections 520 are enabled in a fifth stage. In other embodiments, some of these phases may be combined, and yet further phases may be added.

In some embodiments, the outputs of the Soft XOR are scaled according to a scale factor that is determined, for example, according to the signal to noise ratio or the expected bit error rate of a decoder. In some such embodiments, the scaling is implemented in current mirrors in the signal path section 320. For example, the sections 520 may have digital gain controls. For example, one implementation of such a gain controllable current mirror ties the base of the input transistor to a selected subset of output transistors. Depending of the relative dimensions or gain characteristics of the input transistor and these output transistors, a selectable gain is achieved.

In some embodiments the outputs of the Soft XOR are offset according to an offset factor that is determined, for example, according to the signal to noise ratio or the expected bit error rate of a decoder. In some such embodiments, the offset is implemented by coupling a controllable current source to each of the outputs.

Figure 6A:
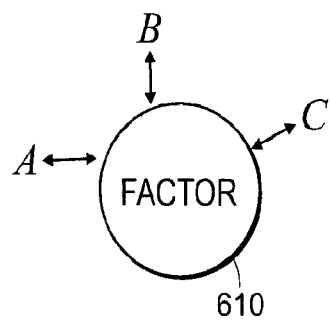
FIG. 6A is a diagram of a factor node.
Figure 6B:
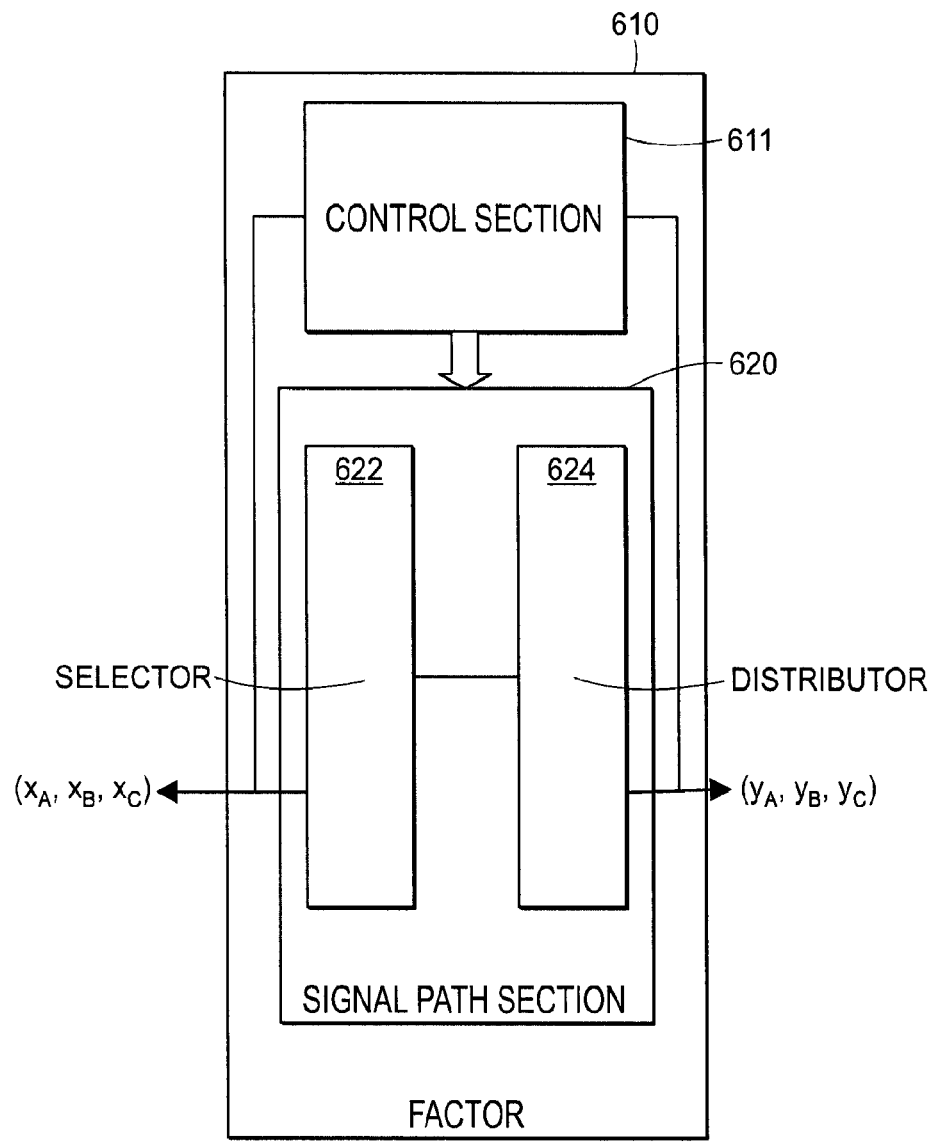
FIG. 6B is a block diagram of a circuit implementation of a factor node.

It should be understood that the use of current mode circuit implementations of factor nodes is not limited to XOR factors. Referring to FIGS. 6A-B, in general, a factor node with links to variable nodes A, B, and C for example, with inputs x from the variable nodes and outputs y to those nodes. Assume that each variable is m-ary (i.e., m>2) then the output $y_A(a)$, associated with value a of variable A, takes on the value $y_A(a) = \min_{b,c}(w(a,b,c) + x_B(b) + x_C(c))$. Note that in an example in which there are 3 variables and each variable can take on one of m=4 values, there are 12 input signal and 12 output signals.

An implementation of a factor node for a more general factor takes the form shown in FIG. 6B, in which a control section 611 determines which signals to pass to the output. For example, in determining the signal $y_A(a)$, the signal values $\tilde{b}$ (an index from 1 to m) and $\tilde{c}$ are determined in the control section to minimize the expression $(w(a,\tilde{b},\tilde{c}) + _B(\tilde{b}) + _C(\tilde{c}))$. These indices then control a signal path section 620, which is analogous to the signal path section 320 in FIG. 3B, in which the signals $x_B(\tilde{b})$ and $x_C(\tilde{c})$ are coupled (thereby summing their currents) via switches to the output signal line for $y_A(a)$. In situations in which the factor represents a hard constraint, the weights $w(a,b,c)$ are either zero or infinite, and therefore do not have to be considered. This is because in the case of a hard constraint, the further current $w(a,\tilde{b},\tilde{c}) = \log 1.0 = 0$ does not have to be added. With soft constraints, a further current of $w(a,\tilde{b},\tilde{c})$ is added to the output signal line.

In some examples, the input signals are obtained from a memory in the form of base voltages that induce corresponding currents, and the stored base voltages of the storage cells are coupled to base connections of output transistors in the distributor according to the determined indices of the minimum terms to cause the desired currents to be applied to the output.

Note that for some more general factors, the control section can operate in a series of iterations, for example, iterating over all combinations of signal values (i.e., (a,b,c) triples in the example) in order to determine the indices of the minimum terms from which the output signals are determined. Once the determined minimum terms are determined, the signal path section is configured to pass the signals from input to output of the factor.

Implementations of the approaches described above may be implemented in various integrated circuit technologies. Also, current representation of signals may be combined with voltage representations in one system. Furthermore, it should be clear that the approaches are applicable to a wide range of factor graphs, in which a whole factor graph or parts of a factor graph are mapped to circuitry that implements the factor and variable nodes, and makes use of analog (or alternatively digital) memory to enable iteration of the message passing algorithm.

It is to be understood that the foregoing description is intended to illustrate and not to limit the scope of the invention.

What is claimed is:

1. A current-mode analog belief propagation processor comprising:
   a plurality of factor circuits corresponding to a factor of a factor graph, wherein each factor circuit accepts current represented inputs and provides current represented outputs; and
   a plurality of memory cells for storing intermediate results of computations, wherein an input of each memory cell is coupled to a current represented output of a factor circuit for storing a charge that is monotonically related to the current represented output of the factor circuit to reproduce a current representation of the current represented output of the factor circuit at the output of the memory cell.

2. The processor of claim 1 wherein the processor is configurable to according to a factor graph specification.

3. The processor of claim 1 wherein:
   the processor further comprises a plurality of current summing elements implementing a bus-based current summation;
   said plurality of current summing elements are coupled between memory cells and factor circuits, and
   each summing element corresponds in operation to a variable of a factor graph according to which the belief propagation processor is configured.

4. The processor of claim 1 wherein at least some of the factor circuits each comprises:
   a control section; and
   a signal path section that is configurable to accept input signals representative of current values and provide output current signals, each output current being configurable to depend on a combination of a selected group of the current values represented in the input signals;
   wherein the control section received the input signals and provides control signals for configuring the signal path section according to a factor.

5. The processor of claim 1 wherein at least some of the factor circuits each comprises a soft XOR factor circuit.

6. The processor of claim 1 wherein each memory cell comprises a charge storage element coupled to one or more current passing elements such that the charge is formed on the charge storage element according to a current through a current passing element during a writing operation, and the current is controlled to reproduce the current through the current passing element according to the stored charge in a reading operation.

7. The processor of claim 1 wherein each memory cell comprises:
an input for accepting a current encoded value in a writing mode;
a transforming element that is coupled to the input in the writing mode and produces a voltage according to a substantially non-linear voltage-current relationship of the transforming element; and
a voltage storage element that retains the produced voltage value;
wherein in a reading mode, the voltage on the voltage storage element provides an input to the transforming element, and the transforming element reproduces the input current according to the voltage-current relationship.

8. The processor of claim 7 wherein the transforming element comprises a transistor.

9. The processor of claim 8 wherein the voltage storage element comprises a capacitor.

10. The processor of claim 7, wherein accuracy of reproducing the current encoded value does not depend on the non-linear voltage-current relationship due to the same transforming element being used during the writing mode and the reading mode.

11. The processor of claim 7, the voltage-current relationship is compressive or logarithmic.

12. The processor of claim 1, wherein each memory cell comprises:
an input transistor for sensing current at the input of the memory cell;
an output transistor matching the input transistor for mirroring the current sensed by the input transistor; and
a capacitor coupled to a gate of the input transistor and a gate the output transistor for storing the charge.

13. The processor of claim 12, wherein each memory cell further comprises:
writing switches configured to store the charge on the capacitor when the writing switches are closed; and
reading switches configured to cause the output of the memory cell to reproduce the current sensed by the input transistor.

14. The processor of claim 1, wherein each memory cell comprises:
an input transistor for sensing current at the input of the memory cell;
a plurality of output transistors matching the input transistor for mirroring the current sensed by the input transistor, wherein the plurality of output transistors correspond to different output buses; and
a capacitor coupled to a gate of the input transistor and a gate the output transistor for storing the charge.

15. The processor of claim 1, wherein each one or more ones of the factor circuits comprises:
storage cells for storing base voltages that induce corresponding currents; and
output transistors in a distributor;
wherein stored base voltages of the storage cells are coupled to base connections of the output transistors according to determined indices of minimum terms to cause desired currents to be applied to an output of the factor circuit.

16. The processor of claim 15, wherein the indices of minimum terms are determined by iterating over combination of signal values.

17. The processor of claim 1, wherein the intermediate results of the computations comprises intermediate results of a Min-Sum algorithm being implemented by the analog believe propagation processor, and the memory cells allow a number of factor circuits performing soft equals or soft XOR computations to be reused in performing the Min-Sum algorithm.

18. A method for performing belief propagation using current-mode storage elements and circuits to mitigate effects of non-linearities and approximations, the method comprising:
receiving current represented inputs by a plurality factor circuits in a current-mode belief propagation processor, wherein the plurality of factor circuits correspond to a factor of a factor graph;
producing current represented outputs by the plurality of factor circuits;
storing intermediate results of computations by a plurality of memory cells by storing a state that is monotonically related to the current represented output of the factor circuit; and
reproducing a current representation of the current represented output of the factor circuit at the output of the memory cell using the state.

19. The method of claim 18, wherein:
storing the state comprises forming a charge on a charge storage element of each memory cell coupled to one or more current passing elements wherein the charge is formed according to a current through a current passing element during a writing operation; and
reproducing the current representation of the current represented output of the factor circuit comprises reproducing the current through the same current passing element according to the stored state in a reading operation.

20. An apparatus for performing belief propagation using current-mode storage elements and circuits to mitigate effects of non-linearities and approximations, the apparatus comprising:
current-mode factor circuit means for processing current represented inputs in a current-mode belief propagation processor and for outputting current represented outputs, wherein the factor circuit means correspond to factors of a factor graph; and
current-mode memory means coupled to factor circuit means for storing a charge that is monotonically related to a current represented output of the factor circuit and for reproducing a current representation of the current represented output of the factor circuit at the output of the memory cell using the charge.

* * * * *